United States Patent
Yeo et al.

(10) Patent No.: US 7,700,267 B2
(45) Date of Patent: Apr. 20, 2010

(54) IMMERSION FLUID FOR IMMERSION LITHOGRAPHY, AND METHOD OF PERFORMING IMMERSION LITHOGRAPHY

(75) Inventors: Yee-Chia Yeo, Hsin-Chu (TW); Burn-Jeng Lin, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1776 days.

(21) Appl. No.: 10/803,712

(22) Filed: Mar. 18, 2004

(65) Prior Publication Data
US 2005/0036183 A1    Feb. 17, 2005

Related U.S. Application Data

(60) Provisional application No. 60/498,195, filed on Aug. 25, 2003, provisional application No. 60/494,154, filed on Aug. 11, 2003.

(51) Int. Cl.
*G03F 7/26* (2006.01)
(52) U.S. Cl. ..................................... 430/311
(58) Field of Classification Search ................ 430/311, 430/322
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 4,509,852 A | 4/1985 | Tabarelli et al. | |
| 5,121,256 A | 6/1992 | Corle et al. | |
| 5,610,683 A | 3/1997 | Takahashi | |
| 5,715,039 A * | 2/1998 | Fukuda et al. | 355/53 |
| 5,900,354 A | 5/1999 | Batchelder | |
| 7,176,522 B2 | 2/2007 | Cheng et al. | |
| 2002/0031319 A1 | 3/2002 | Wang | |
| 2002/0039704 A1 | 4/2002 | Din et al. | |
| 2002/0163629 A1 | 11/2002 | Switkes et al. | |
| 2003/0174408 A1 * | 9/2003 | Rostalski et al. | 359/642 |
| 2004/0038556 A1 * | 2/2004 | French et al. | 438/800 |
| 2004/0175647 A1 * | 9/2004 | French et al. | 430/270.1 |
| 2004/0209411 A1 * | 10/2004 | Fisher et al. | 438/197 |

(Continued)

OTHER PUBLICATIONS

Brown, Theodore L., et al., Chemistry: The Central Science, Prentice Hall, Inc., $7^{th}$ ed., pp. 574-577.*

(Continued)

*Primary Examiner*—Kathleen Duda
*Assistant Examiner*—Brittany Raymond
(74) *Attorney, Agent, or Firm*—Slater & Matsil, L.L.P.

(57) ABSTRACT

An immersion lithographic system 10 comprises an optical surface 51, an immersion fluid 60 with a pH less than 7 contacting at least a portion of the optical surface, and a semiconductor structure 80 having a topmost photoresist layer 70 wherein a portion of the photoresist is in contact with the immersion fluid. Further, a method for illuminating a semiconductor structure 80 having a topmost photoresist layer 70 comprising the steps of: introducing an immersion fluid 60 into a space between an optical surface 51 and the photoresist layer wherein the immersion fluid has a pH of less than 7, and directing light preferably with a wavelength of less than 450 nm through the immersion fluid and onto the photoresist.

30 Claims, 6 Drawing Sheets

U.S. PATENT DOCUMENTS

| | | |
|---|---|---|
| 2005/0007570 A1* | 1/2005 | Streefkerk et al. ............ 355/30 |
| 2005/0018208 A1* | 1/2005 | Levinson ................... 356/517 |
| 2005/0037269 A1* | 2/2005 | Levinson ................... 430/30 |
| 2005/0078286 A1* | 4/2005 | Dierichs et al. ............... 355/30 |
| 2005/0084794 A1 | 4/2005 | Meagley et al. |
| 2005/0123863 A1 | 6/2005 | Chang et al. |
| 2005/0164502 A1* | 7/2005 | Deng et al. ................. 438/689 |
| 2005/0164522 A1* | 7/2005 | Kunz et al. ................. 438/780 |
| 2005/0186513 A1* | 8/2005 | Letz et al. ................... 430/320 |
| 2005/0266683 A1 | 12/2005 | Lee |
| 2006/0072088 A1* | 4/2006 | Lipson et al. ................. 355/53 |
| 2006/0141400 A1 | 6/2006 | Hirayama et al. |
| 2006/0154171 A1* | 7/2006 | Hirayama et al. ........ 430/270.1 |
| 2006/0154188 A1* | 7/2006 | Hirayama et al. ........... 430/338 |
| 2007/0046915 A1* | 3/2007 | Streefkerk et al. ............ 355/53 |
| 2007/0091288 A1 | 4/2007 | Lin et al. |

OTHER PUBLICATIONS

Casiday et al. "Water Hardness Inorganic Reactions Experiment," 1998.*

Hoffnagle, J.A., et al., "Liquid Immersion Deep-Ultraviolet Interferometric Lithography," J. Vacuum Science and Technology B, 1999 American Vacuum Society, vol. 17, No. 6, pp. 3306-3309, Nov./Dec. 1999.

Switkes, M., et al., Immersion Lithography at 157 nm, J. Vacuum Science and Technology B, 2001 American Vacuum Society, vol. 19, No. 6, pp. 2353-2356, Nov./Dec. 2001.

* cited by examiner

IMMERSION FLUID FOR IMMERSION LITHOGRAPHY, AND METHOD OF PERFORMING IMMERSION LITHOGRAPHY

CROSS-REFERENCE TO RELATED APPLICATIONS

This application claims priority based on U.S. Provisional Patent Application Ser. No. 60/498,195, filed Aug. 25, 2003, entitled "Immersion Fluid for Immersion Lithography, and Method of Performing Immersion Lithography". The provisional application is incorporated herein by reference in its entirety.

This application claims priority to U.S. Provisional Application Ser. No. 60/494,154 filed Aug. 11, 2003, which application is incorporated herein by reference in its entirety.

TECHNICAL FIELD

The present invention relates generally to the fabrication of semiconductor devices, and more particularly to an immersion fluid and a system and method for performing immersion lithography.

BACKGROUND

In photolithographic systems, there is a need to achieve a high resolution in order to resolve high-resolution patterns, such as images, lines, or spots. In a photolithographic system employed in the integrated circuit (IC) industry, light is projected onto a resist for the purpose of patterning an electronic device. Photolithographic systems have been used in the IC industry for many decades and are expected to resolve line widths of 50 nm and below in the future. Significant improvement in the resolution of photolithographic systems has been one of the most important enablers for the manufacture of high density and high-speed semiconductor IC chips.

The resolution R of a photolithographic system for a given lithographic constant $k_1$, is given by $R=k_1\lambda/NA$, where $\lambda$ is the operational wavelength of the imaging light source, and the numerical aperture NA is given by the $NA=n \sin \theta$. Angle $\theta$ is the angular semi-aperture of the system, and n is the index of the material filling the space between the system and the substrate to be patterned.

There are three trends that are conventionally employed to effect resolution improvement in photolithographic technology. First, the wavelength $\lambda$ has been progressively reduced from mercury G-line (436 μm) to the ArF excimer laser line (193 nm), and further to 157 nm and possibly into the extreme ultraviolet (EUV) wavelengths. Second, the implementation of resolution enhancement techniques such as phase-shifting masks and off-axis illumination have led to a reduction in the lithographic constant $k_1$ from about 0.6 to about 0.4. Third, the numerical aperture NA has been increased from about 0.35 to about 0.8 with improvements in optical designs, manufacturing techniques, and metrology. However, these conventional techniques of improving the resolution are approaching physical and technical limits. For example, the value of NA, i.e. n sin θ, is limited by the value of n. If free-space optical systems are used, where the value of n is unity, the value of NA has an upper bound of unity.

Recently, immersion lithography has been developed which allows NA to be further increased. In immersion lithography, a substrate to be patterned is immersed in a high-index fluid or an immersion medium, such that the space between the final optical element or lens and the substrate is filled with a high-index fluid (n>1). In this way, the lens can be designed to have an NA larger than 1.

High-index fluids such as perfluoropolyether (PFPE), cyclo-octane, and de-ionized water may be used. Since the value of NA can be further increased, immersion lithography therefore offers better resolution enhancement over conventional lithography. The high-index fluid should satisfy several requirements: it should have a low absorption for the wavelength being used; its index of refraction should be reasonably high to make the index modification worth its while, and it should be chemically compatible with the photoresist on the substrate as well as the optical element and the coatings in contact with the fluid.

In certain prior art schemes of performing immersion lithography where water is used as the immersion fluid, the pH of the water is not controlled. Photoresists, particularly chemically amplified photoresists, may be contaminated by hydroxyl ions ($OH^-$) present in the immersion fluid or water. Certain optic lens materials, such as calcium fluoride, dissolve in water to a certain extent.

The following references are related to aspects of the preferred embodiments and are herein incorporated by reference in their entirety.

[1] M. Switkes et al., "Methods and apparatus employing an index matching medium," U.S. Patent Application Publication No. US 2002/0163629.
[2] J. S. Batchelder, "Method for optical inspection and lithography," U.S. Pat. No. 5,900,354.
[3] K. Takahashi, "Immersion type projection exposure apparatus," U.S. Pat. No. 5,610,683.
[4] T. R. Corle et al., "Lithography system employing a solid immersion lens," U.S. Pat. No. 5,121,256.
[5] J. A. Hoffnagle et al., "Liquid immersion deep-ultraviolet interferometric lithography," *J. Vacuum Science and Technology B*, vol. 17, no. 6, pp. 3306-3309, 1999.
[6] M. Switkes et al., "Immersion lithography at 157 nm," *J. Vacuum Science and Technology B*, vol. 19, no. 6, pp. 2353-2356, 2000.

SUMMARY OF THE INVENTION

The preferred embodiment relates to the field of lithographic systems, and more specifically, to immersion lithographic systems that employ an immersion fluid between a final optic and a substrate. In one aspect, the invention teaches an immersion fluid for use with immersion lithographic systems.

In accordance with a preferred embodiment of the present invention, an immersion fluid with a pH less than 7 contacts at least a portion of the optical surface.

In accordance with another preferred embodiment of the present invention, an immersion lithographic system for projecting light having a wavelength of less than 197 nm comprises an optical surface, an immersion fluid with a pH less than 7 contacting at least a portion of the optical surface, and a semiconductor structure having a topmost photoresist layer wherein a portion of the photoresist is in contact with the immersion fluid.

In accordance with another preferred embodiment of the present invention, a method for illuminating a semiconductor structure having a topmost photoresist layer comprises the steps of, introducing an immersion fluid into a space between an optical surface and the photoresist layer wherein the immersion fluid has a pH of less than 7, and directing optical energy through the immersion fluid and onto the photoresist.

In accordance with yet another preferred embodiment of the present invention, a method for illuminating a semiconductor structure having a topmost photoresist layer comprises the steps of: introducing an immersion fluid into a space between an optical surface and the photoresist layer wherein the immersion fluid has a pH of less than 7, and directing light with a wavelength of less than 450 nm through the immersion fluid and onto the photoresist.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
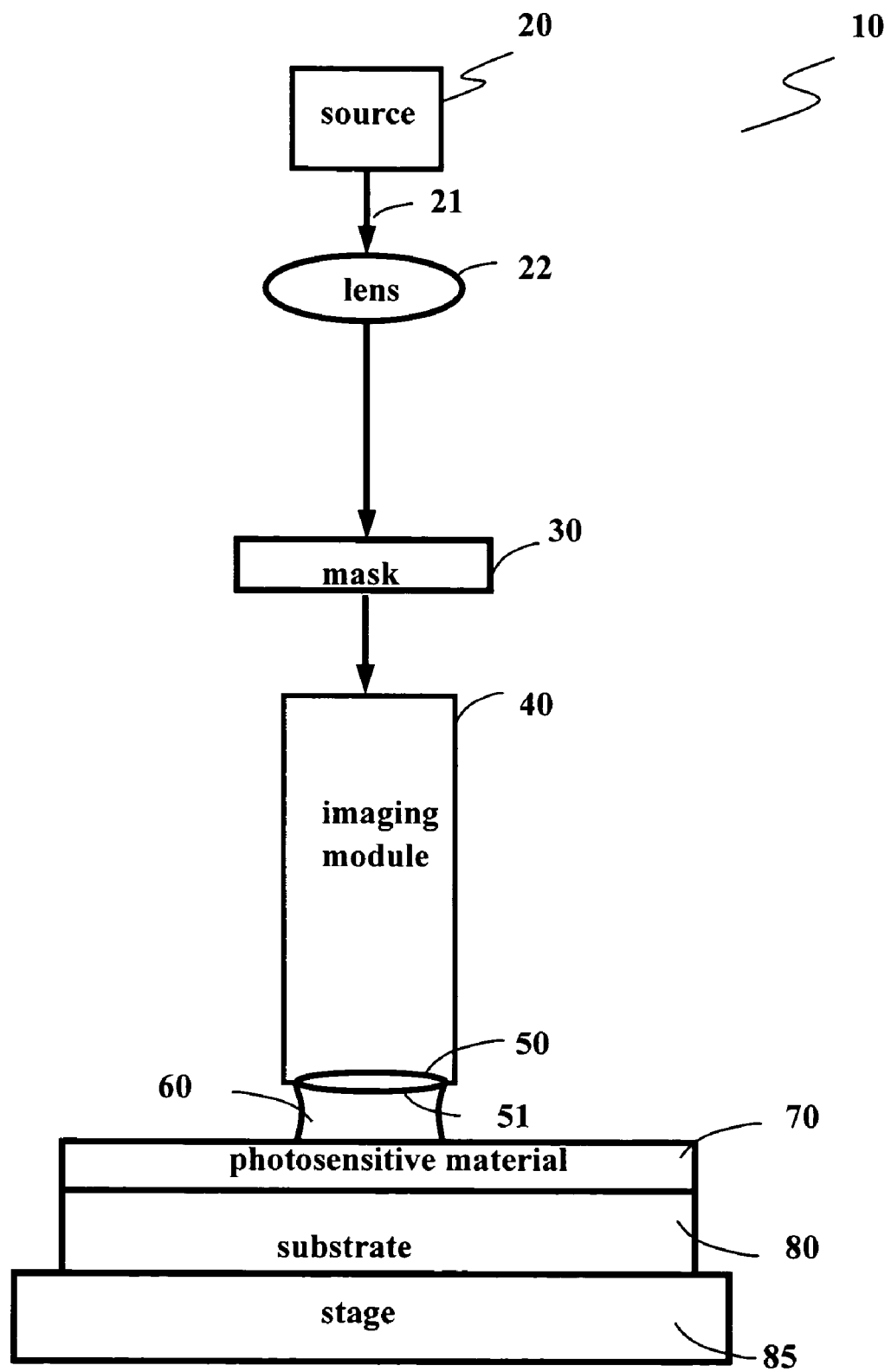
FIG. 1 illustrates a simplified diagram of an immersion lithography system.

A simplified example of an immersion lithography system 10 is illustrated in FIG. 1. System 10 contains a source 20 emitting a beam of optical energy 21 through a lens 22. The energy is then passed through a mask 30 and an imaging module 40, and a final lens 50 having an optical surface 51. A fluid 60 fills at least the space between lens 50 and a photosensitive material 70. Photosensitive material 70 is in contact with a substrate 80 of a semiconductor device.

In the preferred embodiment, the substrate 80 is a semiconductor substrate that is being fabricated as an integrated circuit. For example, the substrate 80 can be a silicon substrate (e.g., monolithic silicon substrate or a silicon-on-insulator) in which transistors (and other components) are formed. These components may be interconnected with metal layers.

The photosensitive material 70 can be a photoresist or other masking material. In the preferred embodiment, the material 70 can be patterned in very small dimensions. For example, polysilicon (or other conductive material) lines can be etched in alignment with the patterns in the material 70 to create, for example, MOS gates having lengths of 50 nm or less. As another example, metallization lines (e.g., copper damascene) can be formed with dimensions of about 200 nm or less.

The substrate 80 is supported on a wafer support structure or stage 85. FIG. 1 illustrates that the liquid 60 is disposed between the optical element 51 and the photosensitive material 70. It should be understood, however, that during the optical patterning, the substrate 80 and/or the stage 85 can be immersed in the immersion fluid 60.

Figure 2A:
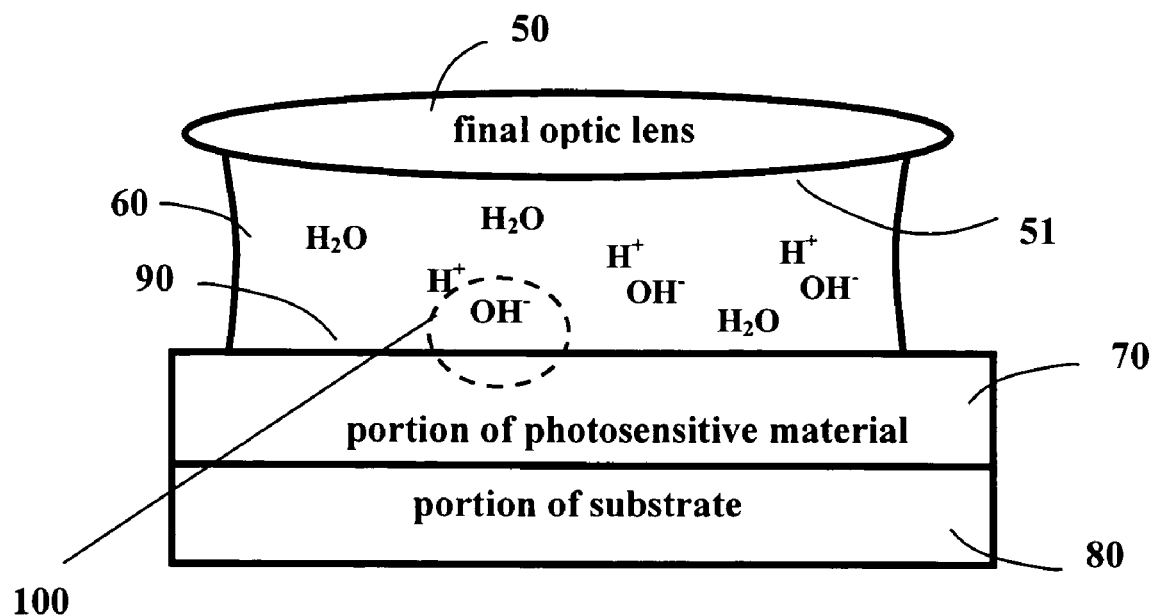
FIGS. 2a and 2b illustrate the interaction between an immersion fluid (water, for example) and an exposed photosensitive material.

Referring to FIG. 2a, a cross-sectional view of the final portion of lithographic system 10 is shown. The final optic lens 50 is in contact with an immersion fluid 60. In this example, the immersion fluid is water. It is understood that other immersion fluids such as cyclo-octane and perfluoropolyether (PFPE) can be used. The immersion fluid may contain hydroxyl ions. In water, hydroxyl ions are present due to the dissociation of water molecules according to the following equilibria:

$$H_2O(l) \leftrightarrows H^+(aq) + OH^-(aq) \quad \text{(Eq. 1)}$$

where H$^+$ is a hydrogen ion, and OH$^-$ is a hydroxyl ion. The symbols l and aq denote liquid and aqueous states, respectively. The fluid 60 contacts a portion of the photosensitive material or photoresist 70 at an interface 90, as shown in FIG. 2a. The photoresist 70 may, for example, be a photoresist used in lithography employing 193 nm or 157 nm or smaller wavelengths.

When a portion of the photosensitive material 70 is exposed to photons of a predetermined dose, a photo-generated catalyst is formed in the exposed portion of the photosensitive material. Photo-generated catalysts are employed in chemically amplified (CA) photoresists, which are widely used in lithography using 193 nm and 157 nm wavelengths. The photo-generated catalysts are usually acid catalysts, as represented by the formula HA. For example, the acid catalyst HA may protonate an ester functional group in a photoresist polymer molecule, resulting in the formation of a developer-soluble carboxylic acid and the regeneration of a proton or hydrogen ion H$^+$. The proton or hydrogen ion then protonates another ester group to result in the formation of another soluble carboxylic acid and the regeneration of H$^+$. This chain reaction comprising protonation, formation of a soluble product, and regeneration of a proton gives rise to chemical amplification.

Figure 2B:
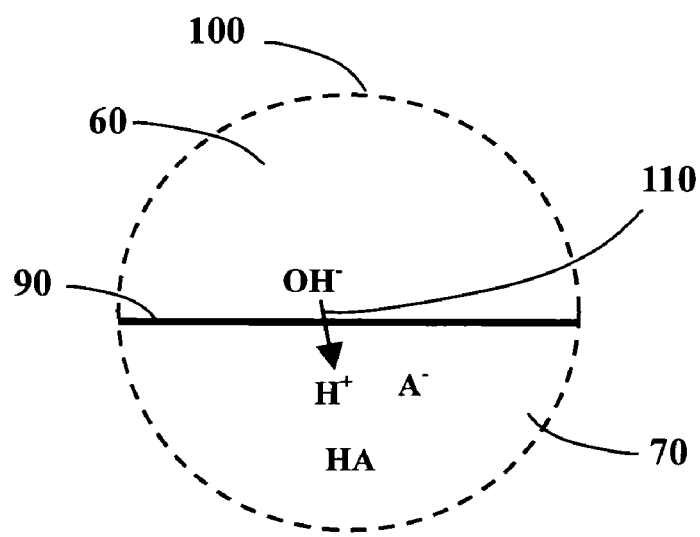

Referring now to FIG. 2b, a magnified perspective 100 of the interface 90 between the water 60 and an exposed portion of the photosensitive material 70 is illustrated. It should be noted that the acid catalyst may be in the form HA, or be in the dissociated form, H$^+$ and A$^-$, as depicted FIG. 2b. As taught in this invention, the presence of significant quantities of hydroxyl ions in the immersion fluid 60, e.g. water, is undesirable. Hydroxyl ions may diffuse (110) into the surface of the photosensitive material, and neutralize the acid catalyst. Neutralization of the acid catalyst depletes the amount of acid catalyst in the immediate vicinity of the water. This impairs the chemical amplification effect, at least in the region in the immediate vicinity of the water.

Figure 3A:
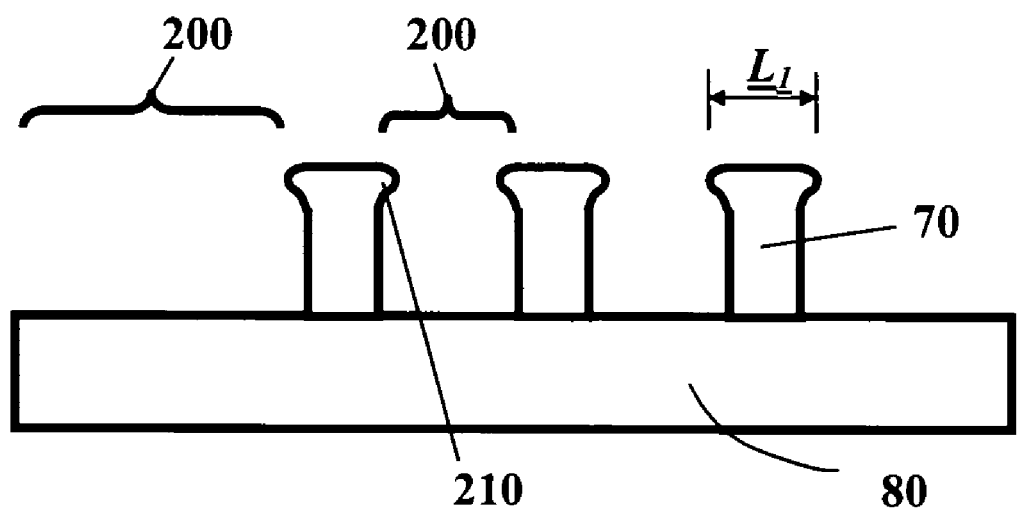
FIGS. 3a and 3b illustrate a top portion of an exposed photoresist having a T-shape, and a top portion of an exposed photoresist having a better resist profile due to elimination of base contamination from the immersion fluid.

Referring now to FIG. 3a, after the development of the photosensitive material or photoresist 70, for example, in a tetramethylammonia hydroxide (TMAH) solution, exposed portions 200 of the photoresist will be dissolved. Regions where the acid catalyst is depleted will dissolve to a lesser extent due to the suppression of the chemical amplification effect. This results in photoresist lines with a T-shaped top 210 being formed after development, as schematically shown in FIG. 3a. Therefore, a consequence of the neutralization of the acid catalyst in the surface region of the photosensitive material is the formation of T-shaped lines with increased linewidth L$_1$.

Figure 3B:
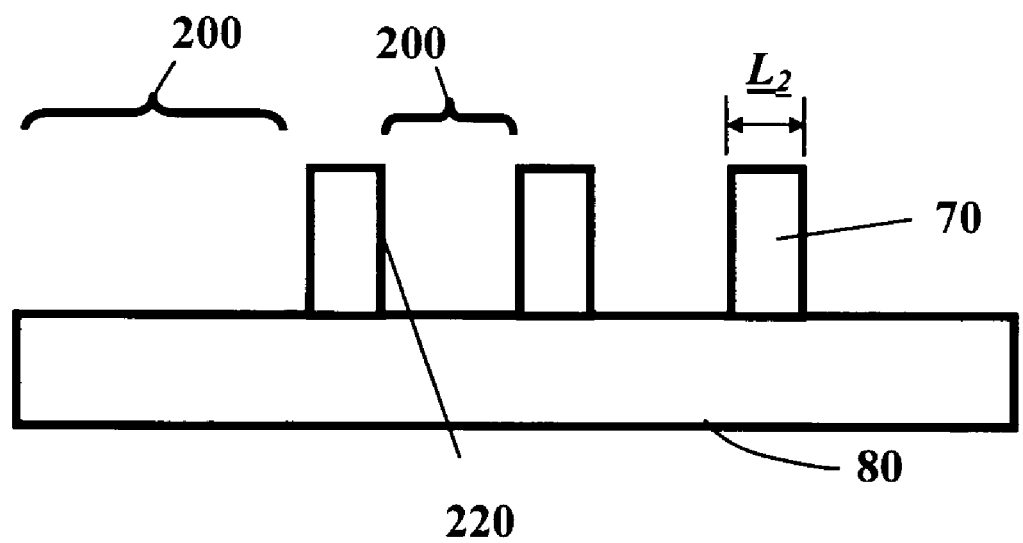

According to a preferred embodiment of the present invention, the concentration of hydroxyl ions in the immersion fluid should be reduced below 10$^{-7}$ mole/liter (mole/L or mol./dm$^3$). The symbols mol., L, and dm denote mole, liter, and decimeter, respectively. By reducing the hydroxyl ion concentration below $10^{-7}$ mole/L, the acid catalyst depletion effect in the surface region of the exposed photoresist can be suppressed. By reducing the concentration of hydroxyl ions and therefore the amount of hydroxyl ions that diffuse into the photoresist, the development of the photoresist will result in a better resist profile 220 with linewidth $L_2$, as shown in FIG. 3b.

One way to reduce the hydroxyl ion concentration in water is to add excess protons or hydrogen ions. The addition of excess hydrogen ions in water pushes the equilibria described by Eq. 1 towards the left, so that at equilibrium, the concentration of hydroxyl ions is less than $10^{-7}$ mole/liter. The addition of hydrogen ions may be effected by the addition of an acid in the water. The acid may be an organic acid such as ethanoic acid or methanoic acid, or the acid may be an inorganic acid such as dilute hydrofluoric acid or dilute sulphuric acid, or combinations thereof.

Therefore, according to a preferred embodiment of the present invention, the immersion fluid should preferably have an excess of hydrogen ions to reduce the equilibrium concentration of hydroxyl ions. The concentration of hydrogen ions in the immersion fluid at equilibrium should preferably be more than $10^{-7}$ mole/L, i.e., the pH of the immersion fluid should preferably be less than 7. The concentration of hydrogen ions is more preferably in the range of about $10^{-7}$ to about $10^{-2}$ mole/L, more preferably in the range of about $10^{-7}$ to about $10^{-4}$ mole/L, even more preferably in the range of about $10^{-7}$ to about $10^{-5}$ mole/L, and even more preferably in the range of about $10^{-7}$ to about $10^{-6}$ mole/L. The above-mentioned concentrations can be measured at room temperature, i.e., 300 degrees Kelvin. Corresponding to the above mentioned hydrogen ion concentrations, the immersion fluid should have a pH in the range of less than 7, preferably about 2 to about 7, more preferably about 4 to about 7, more preferably about 5 to about 7, and even more preferably about 6 to about 7. The pH is commonly defined as the $-\log [H^+]$, where $[H^+]$ denotes the molar concentration of hydrogen ions. The addition of an acid in the immersion fluid may even improve the chemical amplification effect in the photoresist.

Figure 4A:
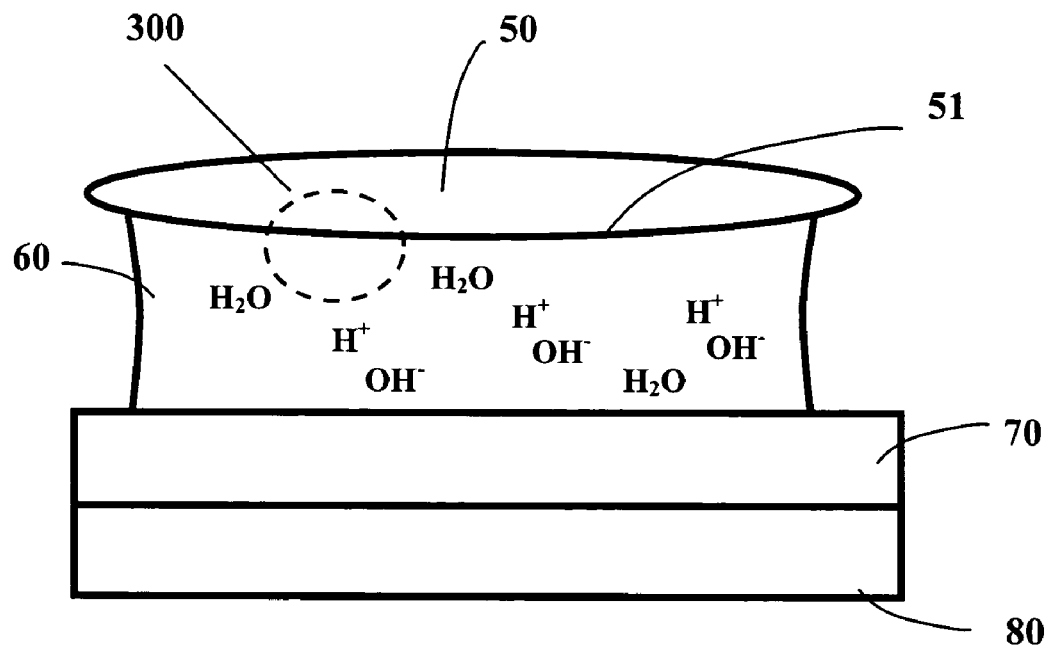
FIGS. 4a and 4b illustrate the interaction between an immersion fluid (water, for example) and a lens material.
Figure 4B:
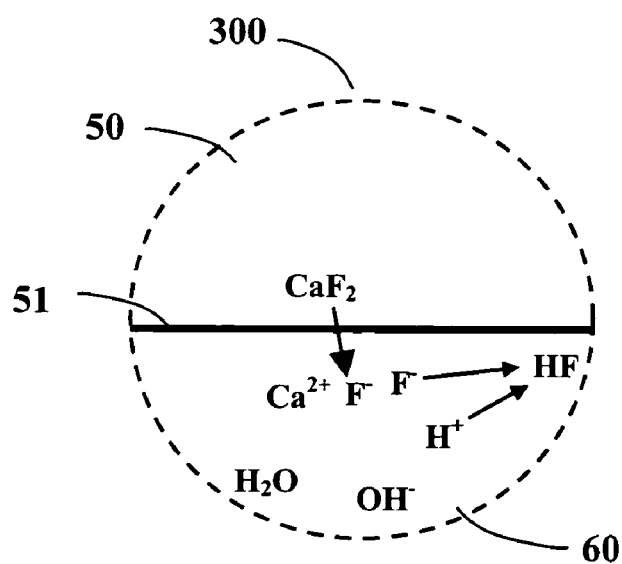

Referring now to FIG. 4a, a cross-sectional view shows the immersion fluid 60 (e.g., water) in contact with the final optic lens 50. A magnified perspective 300 of the interface between the water and a surface of the final optic lens is illustrated in FIG. 4b. The material constituting the optic lens may dissolve into the immersion fluid, to an extent that may be very small. The lens material may be fused silica ($SiO_2$), magnesium fluoride ($MgF_2$), or calcium fluoride ($CaF_2$). For example, in a preferred embodiment, the lens material is calcium fluoride. Calcium fluoride dissolves in water to form aqueous calcium ions ($Ca^+$) and fluoride ions ($F^-$), according to the following equilibria:

(Eq. 2)

About $3 \times 10^{-4}$ moles of solid $CaF_2$ dissolves in a liter of water with a pH of 7 at room temperature. The water or immersion fluid used in lithography may be constantly flowing, so that the $CaF_2$ lens material may be constantly being dissolved and removed with the flow of water. The dissolved amount may be large when the equipment is used for an extended period of time, e.g., a few years. Dissolution of the lens material may be non-uniform across different regions of the lens so that it results in a distortion of the lens surface. This will potentially result in image distortion and malfunction of the equipment.

Figure 5:
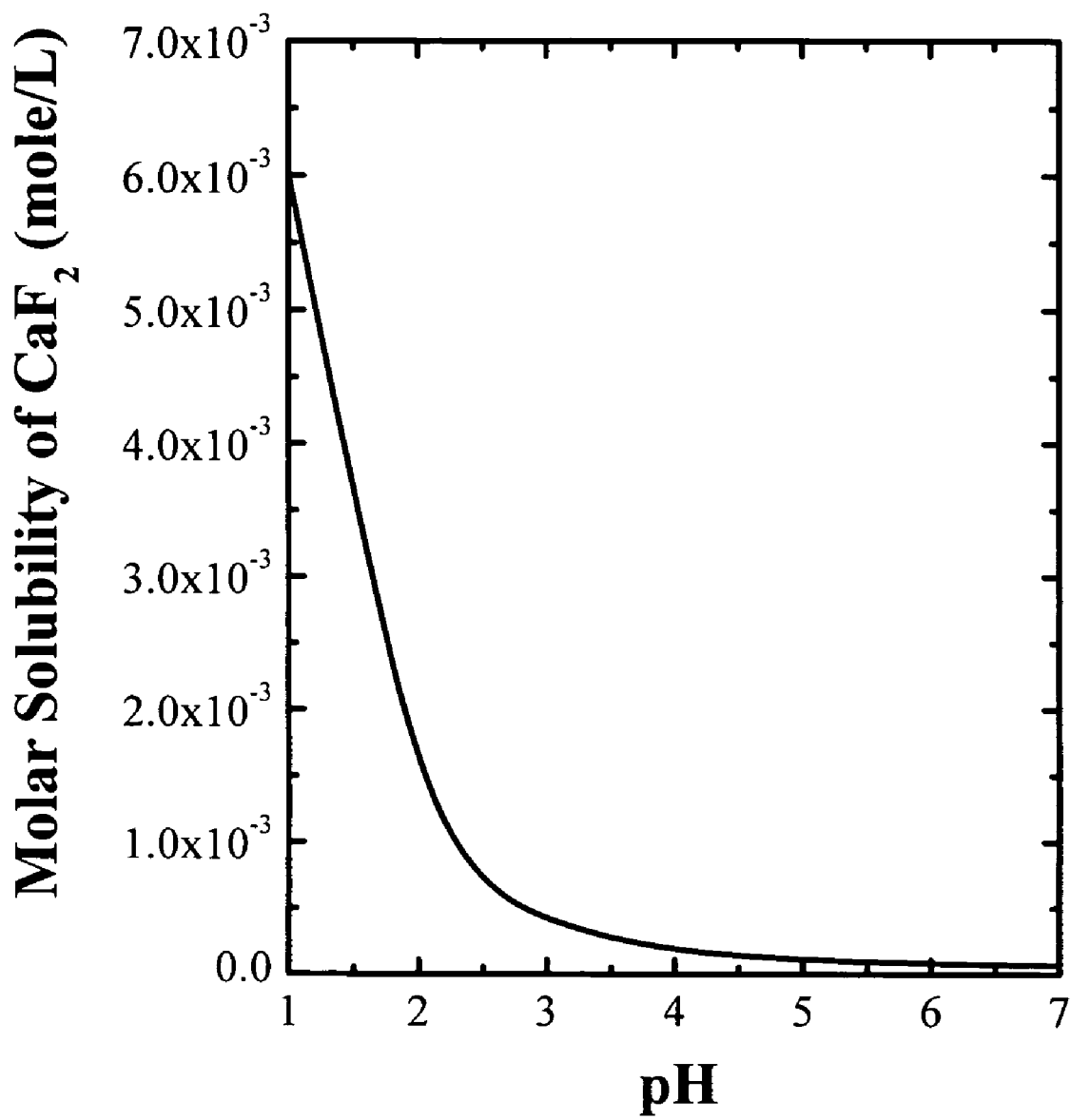
FIG. 5 illustrates the solubility of a calcium fluoride lens as a function of the pH of an immersion fluid.

FIG. 5 shows the molar solubility of $CaF_2$ in water with various pH or acidity. When the pH of water is reduced from 7, i.e., the acidity is increased, the solubility of $CaF_2$ increases. The increase in the solubility of $CaF_2$ is more significant below a pH of 4. Dissolution of calcium fluoride in acidic solution is due to the following reason. When acid or hydrogen ions are added into the water, combination of hydrogen ions and fluoride ions (F—) occurs to form aqueous hydrogen fluoride (HF):

(Eq. 3)

Since fluoride ions are consumed by the formation of aqueous hydrogen fluoride, the equilibria described by Eq. 2 shifts to the right, resulting in more dissolution of solid $CaF_2$. This worsens the loss of $CaF_2$ material from the lens. Therefore, while a pH of less than 7 is preferred for suppression of the acid catalyst depletion effect, the pH should not be too low to result in significant dissolution of the calcium fluoride lens material. Therefore, while this invention specifies that the immersion fluid should have a pH in the range of less than 7, the pH should be preferably about 2 to about 7, more preferably about 4 to about 7, even more preferably about 5 to about 7, and even more preferably about 6 to about 7.

According to a further preferred embodiment of the present invention, the common ion effect may be exploited to reduce the solubility of the lens material. For example, if the lens material in contact with the water is $CaF_2$, the water may intentionally comprise a fluoride ion of a predetermined concentration to suppress the dissolution of $CaF_2$. According to the common ion effect, the intentional addition of fluoride ions into the water shifts the equilibria described by Eq. 2 to the left, and effectively suppresses the $CaF_2$ dissolution.

Figure 6:
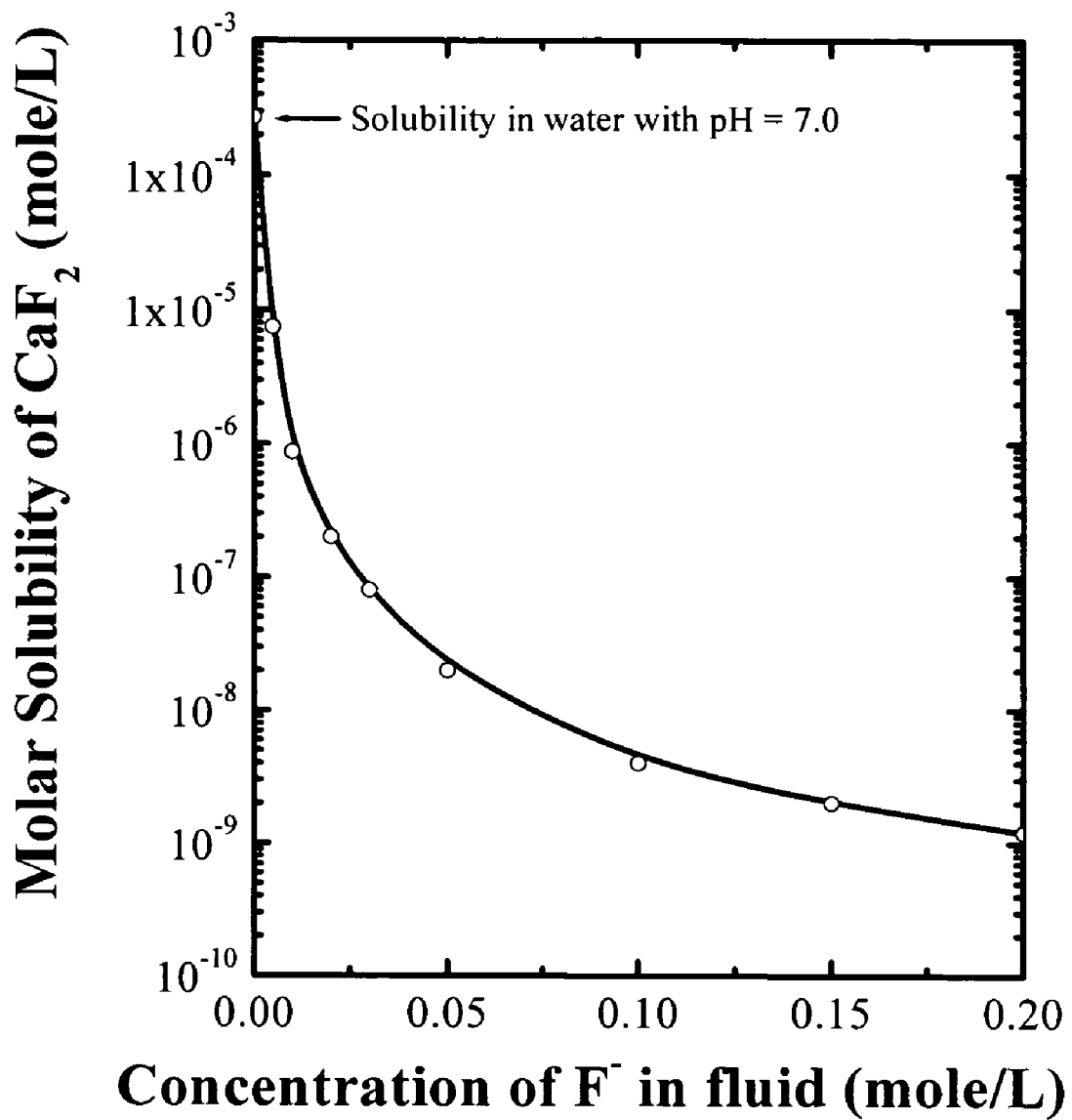
FIG. 6 illustrates the solubility of a calcium fluoride lens as a function of the concentration of F$^-$ in an immersion fluid.

Referring now to FIG. 6, the calculated molar solubility of $CaF_2$ is reduced with increased fluoride concentration in the immersion fluid. The fluoride ion may be introduced, for example, by the addition of a fluoride-containing compound in the water. The fluoride-containing compound may be a highly soluble fluoride containing compounds such as sodium fluoride, potassium fluoride, hydrogen fluoride, or combinations thereof. In a preferred embodiment, the fluoride-containing compound is hydrogen fluoride, and more preferably a combination of hydrogen fluoride and sodium fluoride. The fluoride concentration is preferably above 0.01 mole/L, more preferably above 0.05 mole/L, and even more preferably above 0.1 mole/L.

It should be noted that the immersion lithographic system as described herein may employ one or more versions of immersion lithography that are already known. For example, the system may employ local immersion where the immersion fluid is disposed between the final optic lens and a portion of the wafer to be exposed. In another example, the system may employ wafer immersion where the entire wafer is immersed in the immersion fluid. In yet another example, the system may employ stage immersion where the entire stage is immersed in the immersion fluid.

While several embodiments of the invention, together with modifications thereof, have been described in detail herein and illustrated in the accompanying drawings, it will be evident that various modifications are possible without departing from the scope of the preferred embodiment. The examples given are intended to be illustrative rather than exclusive.

What is claimed is:

1. A method for illuminating a semiconductor structure having a topmost photoresist layer, comprising the steps of:
providing the semiconductor structure comprising an integrated circuit that includes transistors with a gate length not greater than 50 nm, the structure coated with the topmost photoresist layer, the topmost photoresist layer comprising a chemically amplified photoresist that forms a photo-generated acid catalyst of the form HA, where H is hydrogen;

introducing an immersion fluid comprising water and a fluorine containing compound into a space between an optical surface that is soluble in water and the photoresist layer, said immersion fluid having a pH of less than 7 and the water in contact with a portion of the photoresist layer;

directing optical energy through the immersion fluid and onto said photoresist layer; and subsequently developing the photoresist layer.

2. The method of claim 1 wherein the pH of the immersion fluid is between 2 and less than 7.

3. The method of claim 2 wherein the pH of the immersion fluid is between 4 and less than 7.

4. The method of claim 3 wherein the pH of the immersion fluid is between 5 and less than 7.

5. The method of claim 4 wherein the pH of the immersion fluid is between 6 and less than 7.

6. The method of claim 1 wherein the immersion fluid comprises hydrogen ions with a concentration in the range of greater than $10^{-7}$ to $10^{-2}$ mole/L.

7. The method of claim 6 wherein the immersion fluid comprises hydrogen ions with a concentration in the range of greater than $10^{-7}$ to $10^{-4}$ mole/L.

8. The method of claim 7 wherein the immersion fluid comprises hydrogen ions with a concentration in the range of greater than $10^{-7}$ to $10^{-5}$ mole/L.

9. The method of claim 8 wherein the immersion fluid comprises hydrogen ions with a concentration in the range of greater than $10^{-7}$ to $10^{-6}$ mole/L.

10. The method of claim 1 wherein the optical surface comprises silicon oxide.

11. The method of claim 1 wherein the optical surface comprises calcium fluoride.

12. The method of claim 11 wherein the immersion fluid comprises fluoride ions with a concentration in the range of greater than 0.01 mole/L.

13. The method of claim 11 wherein the immersion fluid comprises fluoride ions with a concentration in the range of greater than 0.05 mole/L.

14. The method of claim 11 wherein the immersion fluid comprises fluoride ions with a concentration in the range of greater than 0.1 mole/L.

15. The method of claim 1 wherein the fluorine containing compound comprises a compound selected from the group consisting of sodium fluoride, potassium fluoride, hydrogen fluoride, and combinations thereof.

16. The method of claim 1 wherein the semiconductor structure is immersed in the immersion fluid.

17. The method of claim 1 further comprising a wafer support underlying the semiconductor structure.

18. The method of claim 17 wherein the wafer support is immersed in the immersion fluid.

19. The method of claim 1 wherein the step of developing the photoresist layer comprises immersing the photoresist in a tetramethylammonia hydroxide solution.

20. A method for illuminating a semiconductor structure having a topmost photoresist layer, comprising the steps of:

providing the semiconductor structure comprising an integrated circuit that includes transistors with a gate length not greater than 50 nm, coated with the topmost photoresist layer, the topmost photoresist layer being a chemically amplified photoresist that forms a photo-generated acid catalyst of the form HA, where H is hydrogen;

introducing water having a fluorine containing compound dissolved therein into a space between an optical surface that is soluble in water and formed of a material including fluoride and the layer, said water having a pH of less than 7, the water contacting a portion of the optical surface and a portion of the photoresist layer;

directing light with a wavelength of less than 450 nm through the water and onto said photoresist; and subsequently developing the photoresist layer.

21. The method of claim 20 wherein the pH of the water is in the range of 2 to less than 7.

22. The method of claim 21 wherein the pH of the water is in the range of 5 to less than 7.

23. The method of claim 22 wherein the pH of the water is in the range of 6 to less than 7.

24. The method of claim 20 wherein the optical surface comprises silicon oxide.

25. The method of claim 20 wherein the optical surface comprises calcium fluoride.

26. The method of claim 20 wherein the fluorine containing compound comprises a compound selected from the group consisting of sodium fluoride, potassium fluoride, hydrogen fluoride, and combinations thereof.

27. The method of claim 20 wherein the water comprises fluoride ions with a concentration in the range of greater than 0.01 mole/L.

28. The method of claim 20 wherein the semiconductor structure is immersed in the water.

29. The method of claim 20 further comprising a wafer support underlying the semiconductor structure.

30. The method of claim 29 wherein the wafer support is immersed in the water.

* * * * *